(12) United States Patent
Loubet et al.

(10) Patent No.: US 10,910,273 B2
(45) Date of Patent: Feb. 2, 2021

(54) FORMING SHALLOW TRENCH ISOLATION REGIONS FOR NANOSHEET FIELD-EFFECT TRANSISTOR DEVICES USING SACRIFICIAL EPITAXIAL LAYER

(71) Applicant: International Business Machines Corporation, Armonk, NY (US)

(72) Inventors: Nicolas Loubet, Guilderland, NY (US); Richard A. Conti, Altamont, NY (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 16/284,682

(22) Filed: Feb. 25, 2019

(65) Prior Publication Data

US 2020/0273753 A1  Aug. 27, 2020

(51) Int. Cl.

| H01L 21/8234 | (2006.01) |
|---|---|
| H01L 29/78 | (2006.01) |
| H01L 29/06 | (2006.01) |
| H01L 29/66 | (2006.01) |
| H01L 27/088 | (2006.01) |
| H01L 29/165 | (2006.01) |
| H01L 21/308 | (2006.01) |
| H01L 21/02 | (2006.01) |

(52) U.S. Cl.
CPC ........ *H01L 21/823412* (2013.01); *H01L 21/02532* (2013.01); *H01L 21/02603* (2013.01); *H01L 21/3086* (2013.01); *H01L 21/823431* (2013.01); *H01L 21/823481* (2013.01); *H01L 27/0886* (2013.01); *H01L 29/0649* (2013.01); *H01L 29/0673* (2013.01); *H01L 29/165* (2013.01); *H01L 29/66545* (2013.01); *H01L 29/66795* (2013.01); *H01L 29/785* (2013.01)

(58) Field of Classification Search
CPC .................................................. H01L 29/66795
See application file for complete search history.

(56) References Cited

U.S. PATENT DOCUMENTS

| 5,254,873 A | 10/1993 | Poon et al. |
|---|---|---|
| 6,441,435 B1 | 8/2002 | Chan |

(Continued)

*Primary Examiner* — Thao P Le
(74) *Attorney, Agent, or Firm* — Douglas Pearson; Ryan, Mason & Lewis, LLP (57) ABSTRACT

A method of forming a semiconductor structure includes forming a semiconductor layer stack including a substrate and a nanosheet channel stack including alternating layers of a sacrificial material and a semiconducting material providing nanosheet channels for nanosheet field-effect transistors. The method also includes forming vertical fins in the semiconductor layer stack, forming a liner on sidewalls of the vertical fins, and forming a sacrificial epitaxial layer over the substrate surrounding the vertical fins. The method further includes replacing the sacrificial epitaxial layer with a first dielectric layer, removing the liner to form air gaps between the first dielectric layer and sidewalls of the vertical fins, and forming a second dielectric layer in the air gaps between the first dielectric layer and sidewalls of the vertical fins. The first and second dielectric layers provide shallow trench isolation regions surrounding sidewalls of the vertical fins below the nanosheet channel stack.

14 Claims, 7 Drawing Sheets

(56) References Cited

U.S. PATENT DOCUMENTS

| | | |
|---|---|---|
| 8,828,851 B2 | 9/2014 | Loubet et al. |
| 9,318,581 B1 | 4/2016 | Guo et al. |
| 9,536,773 B2 | 1/2017 | Tsai et al. |
| 9,786,547 B2 | 10/2017 | Cheng et al. |
| 9,892,961 B1* | 2/2018 | Cheng ................ H01L 21/0217 |
| 9,899,269 B2 | 2/2018 | Ching et al. |
| 10,049,913 B2 | 8/2018 | Tapily |
| 2013/0119506 A1 | 5/2013 | Hokazono |
| 2013/0134513 A1* | 5/2013 | Standaert ............. H01L 29/785 257/347 |
| 2015/0263122 A1* | 9/2015 | Hsiao ................. H01L 29/6656 257/401 |
| 2018/0090494 A1 | 3/2018 | Chao et al. |
| 2018/0166319 A1* | 6/2018 | Park .................... H01L 29/6653 |
| 2020/0020776 A1* | 1/2020 | Yang ................ H01L 21/76897 |

* cited by examiner

FORMING SHALLOW TRENCH ISOLATION REGIONS FOR NANOSHEET FIELD-EFFECT TRANSISTOR DEVICES USING SACRIFICIAL EPITAXIAL LAYER

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming shallow trench isolation regions for nanosheet field-effect transistor devices.

In one embodiment, a method of forming a semiconductor structure comprises forming a semiconductor layer stack comprising a substrate and a nanosheet channel stack over the substrate, the nanosheet channel stack comprising alternating layers of a sacrificial material and a semiconducting material providing nanosheet channels for one or more nanosheet field-effect transistors. The method also comprises forming one or more vertical fins in at least a portion of the semiconductor layer stack, forming a liner on vertical sidewalls of the one or more vertical fins, and forming a sacrificial epitaxial layer over a top surface of the substrate surrounding the one or more vertical fins. The method further comprises replacing the sacrificial epitaxial layer with a first dielectric layer, removing the liner to form air gaps between the first dielectric layer and the vertical sidewalls of the one or more vertical fins, and forming a second dielectric layer in the air gaps between the first dielectric layer and the vertical sidewalls of the one or more vertical fins. The first dielectric layer and the second dielectric layer provide shallow trench isolation regions surrounding at least a portion of the vertical sidewalls of the one or more vertical fins below the nanosheet channel stack.

In another embodiment, a semiconductor structure comprises a substrate and one or more vertical fins disposed over a top surface of the substrate, the one or more vertical fins comprising a first semiconductor layer and a nanosheet channel stack disposed over the first semiconductor layer, the nanosheet channel stack comprising one or more layers of a semiconducting material providing nanosheet channels for one or more nanosheet field-effect transistors. The semiconductor structure also comprises a first dielectric layer disposed over the top surface of the substrate spaced apart from vertical sidewalls of the one or more vertical fins, and a second dielectric layer disposed over the top surface of the substrate between the first dielectric layer and the vertical sidewalls of the first semiconductor layer. The first dielectric layer and the second dielectric layer provide shallow trench isolation regions surrounding at least a portion of the vertical sidewalls of the first semiconductor layer below the nanosheet channel stack.

In another embodiment, an integrated circuit comprises a nanosheet field-effect transistor structure comprising a substrate and one or more vertical fins disposed over a top surface of the substrate, the one or more vertical fins comprising a first semiconductor layer and a nanosheet channel stack disposed over the first semiconductor layer, the nanosheet channel stack comprising one or more layers of a semiconducting material providing nanosheet channels for one or more nanosheet field-effect transistors of the nanosheet field-effect transistor structure. The nanosheet field-effect transistor structure also comprises a first dielectric layer disposed over the top surface of the substrate spaced apart from vertical sidewalls of the one or more vertical fins, and a second dielectric layer disposed over the top surface of the substrate between the first dielectric layer and the vertical sidewalls of the first semiconductor layer. The first dielectric layer and the second dielectric layer provide shallow trench isolation regions surrounding at least a portion of the vertical sidewalls of the first semiconductor layer below the nanosheet channel stack.

DETAILED DESCRIPTION

Illustrative embodiments of the invention may be described herein in the context of illustrative methods for forming shallow trench isolation regions for nanosheet field-effect transistor devices, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

In some embodiments, techniques for reducing the size of FETs includes the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

For nanosheet FETs and other types of FETs such as fin-type FETs (FinFETs), it may be difficult to form shallow trench isolation (STI) layers or regions. For example, techniques for forming STI regions may include flowable chemical vapor deposition (FCVD) to form an oxide. Due to the high aspect ratio of regions to be filled (e.g., between vertical fins of nanosheet stacks formed over a substrate), voids may be formed during FCVD processing. In addition, there may be issues related to charges in a liner (e.g., a nitride liner) that protects sidewalls of the vertical fins. The liner may be used to protect the sacrificial layers in the nanosheet stacks (e.g., for lateral protection of SiGe formed between Si nanosheets providing channels for the nanosheet FETs). Further, there may be various issues associated with planarization (e.g., chemical mechanical planarization (CMP)) techniques that are used in various processing steps. For example, CMP steps may need to be adjusted in order to avoid eroding the top of vertical fin structures.

Illustrative embodiments provide techniques for forming STI layers or regions without requiring the use of CMP or other planarization techniques. To do so, some embodiments use a sacrificial material (e.g., SiGe) that can be selectively oxidized relative to a liner material (e.g., a nitride) at moderate temperatures (e.g., temperatures in the range of 400 degrees Celsius (° C.) to 800° C.). Other embodiments similarly make use of the sacrificial material that can be removed and replaced with a dielectric material used for the STI layer or region, again selective to the liner material.

Various embodiments are described below in the context of forming STI regions for nanosheet structures. In some embodiments, SiGe is oxidized selective to Si with a low temperature (e.g., temperature in the range of 400° C. to 800° C.) and high pressure (e.g., pressure in the range of over 1 atmosphere) oxidation process that converts SiGe to silicon germanium oxide (SiGeOx). Remaining germanium (Ge) in the SiGeOx is then removed with additional thermal treatment after the selective oxidation of SiGe to form silicon oxide (SiOx) regions. A liner formed adjacent vertical sidewalls of the vertical fins of nanosheet stacks is then selectively removed and replaced with a dielectric material that, together with the SiOx formed by selective oxidation of SiGe followed be removal of remaining Ge, provides STI layers or regions between the vertical fins of nanosheet stacks. The liner may be formed so as to protect the nanosheet stack (e.g., to protect SiGe layers in the nanosheet stack).

In other embodiments, the SiGe is selectively etched (e.g., following a fin cut process that exposes edges of the SiGe at lateral ends of the vertical fins of nanosheet stacks) and replaced with a dielectric. The liner formed adjacent the vertical sidewalls of the vertical fins of nanosheet stacks is then selectively removed and filled with dielectric to provide STI layers or regions between the vertical fins of nanosheet stacks.

Advantageously, the techniques described herein for forming STI layers or regions allow the STI layers or regions to be formed without lateral erosion of nanosheet structures. Further, the STI layers or regions may be fully formed of an oxide material, as the liner (e.g., formed of a nitride material) adjacent the vertical sidewalls of the vertical fins of nanosheet stacks is removed and replaced with an oxide.

Illustrative processes for forming STI layers or regions will now be described with respect to FIGS. 1-14.

Figure 1:
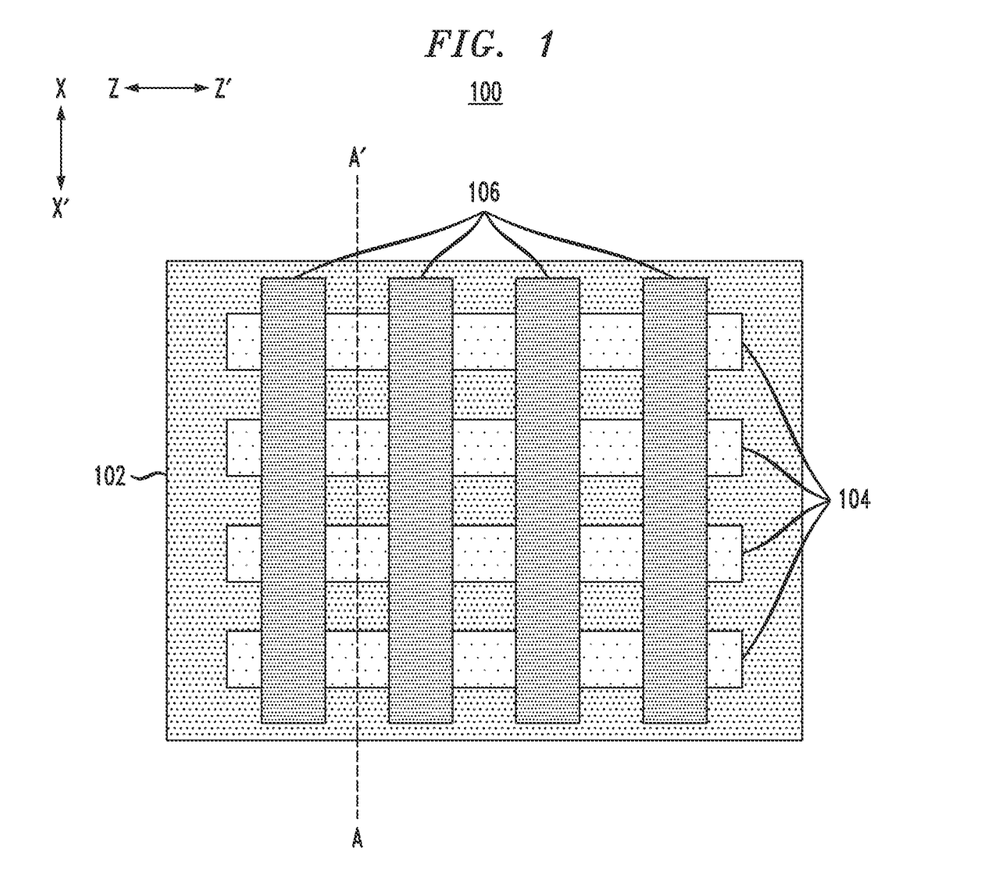
FIG. 1 depicts a top-down view of a semiconductor structure including an isolation layer, one or more fin channel regions and one or more gate regions, according to an embodiment of the invention.

FIG. 1 shows a top-down view 100, illustrating an isolation region 102, fin regions 104 and gate regions 106 of a resulting structure. The fin regions 104 may include FinFET structures or gate all around (GAA) device channels for nanosheet FET structures. FIGS. 2-10, 13 and 14 are each cross-sectional view taken along the line A-A (e.g., across the fin regions 104) through the processing steps for forming STI regions providing isolation layer 102.

Figure 2:
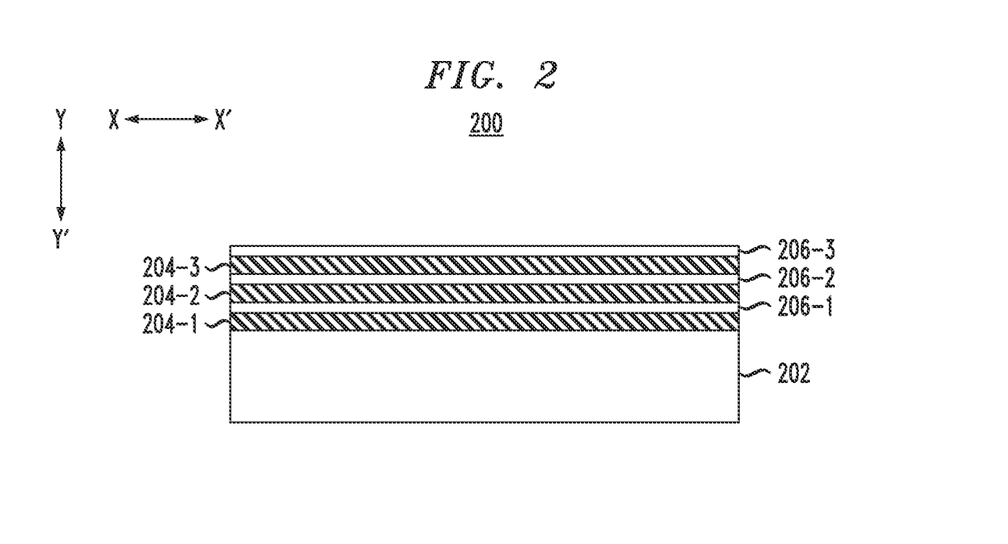
FIG. 2 depicts a cross-sectional view of a semiconductor layer stack, according to an embodiment of the invention.

FIG. 2 shows a cross-sectional view 200 of a semiconductor layer stack including a substrate 202, and a nanosheet stack including alternating layers of a sacrificial material and a channel material. In FIG. 2, the nanosheet stack includes a set of sacrificial layers 204-1, 204-2 and 204-3 (collectively, sacrificial layers 204) and channel layers 206-1, 206-2 and 206-3 (collectively, channel layers 206).

The substrate 202 and channel layers 206 may be formed of any suitable semiconductor structure, including various silicon-containing materials such as Si, SiGe, silicon germanium carbide (SiGeC), silicon carbide (SiC) and multilayers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The sacrificial layers 204 are formed from a material that may be removed selective to the material of the substrate 202 and channel layers 206. In the description below, it is assumed that the substrate 202 and channel layers 206 are formed of Si, while the sacrificial layers 204 are formed of SiGe. In some embodiments, the sacrificial layers 204 may be formed of SiGe with a germanium percentage (Ge %) of 20-25%.

The horizontal thickness or width (in direction X-X') of the FIG. 1 structure may vary, such as based on the number of vertical fins of nanosheet stacks that are to be formed therefrom as described in further detail below. The vertical thickness or height (in direction Y-Y') of the substrate 202 may be in the range of several hundreds of microns. The vertical thickness or height (in direction Y-Y') of each of the sacrificial layers 204 may be in the range of 4 nm to 20 nm. The vertical thickness or height (in direction Y-Y') of each of the channel layers 206 may be in the range of 4 nm to 20 nm.

Figure 3:
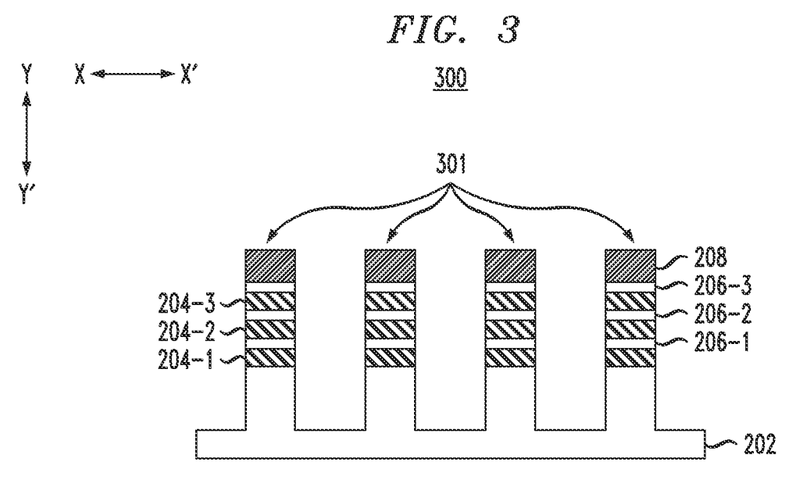
FIG. 3 depicts a cross-sectional view of the FIG. 2 structure following fin patterning using a hard mask layer, according to an embodiment of the invention.

FIG. 3 shows a cross-sectional view 300 of the FIG. 2 structure following fin patterning using a hard mask layer 208 to form a set of vertical fins 301. The fin patterning may utilize sidewall image transfer (SIT) or other suitable techniques such as lithography and etching including reactive-ion etching (RIE), etc. Although FIG. 3 shows an example where four vertical fins 301 are formed, it should be appreciated that more or fewer than four vertical fins may be formed as desired for a particular application. Each of the vertical fins 301 may have a width or horizontal thickness (in direction X-X') in the range of 10 nm to 150 nm. As illustrated in FIG. 3, the fin patterning etches portions of the substrate 202 below the sacrificial layer 204-1, such that each of the vertical fins 301 has a height or vertical thickness (in direction Y-Y') in the range of 50 nm to 300 nm.

Figure 4:
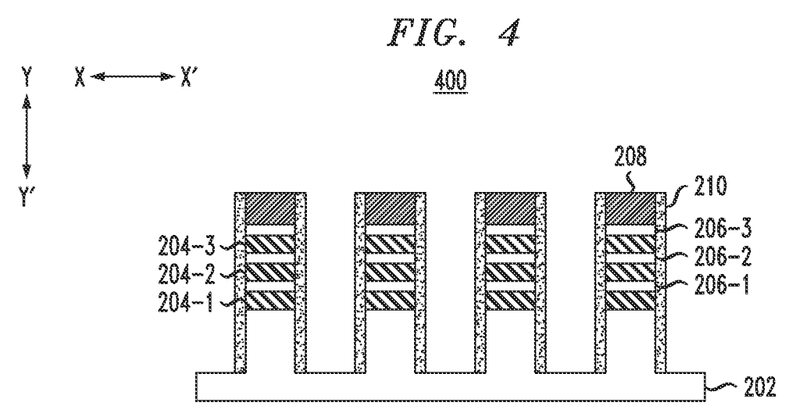
FIG. 4 depicts a cross-sectional view of the FIG. 3 structure following formation of a liner, according to an embodiment of the invention.

The hard mask layer 208 may be formed of a nitride such as silicon nitride (SiN), although other suitable materials may be used. In some embodiments, the hard mask layer 208 is formed as a multi-layer, such as a multi-layer of two layers including a nitride and oxide (e.g., SiN and silicon dioxide ($SiO_2$)), a multi-layer of three layers including one or more nitride and one or more oxide layers (e.g., SiN/$SiO_2$/SiN, $SiO_2$/SiN/$SiO_2$), etc. The hard mask layer 208 may have a height or vertical thickness (in direction Y-Y') in the range of 5 nm to 50 nm FIG. 4 shows a cross-sectional view 400 of the FIG. 3 structure following formation of a liner 210 on vertical sidewalls of the vertical fins 301. The liner 210 may be formed of SiN or another suitable material. In some embodiments, SiN is a preferred material for the liner 210 as it provides a good barrier to oxygen during later processing (e.g., the selective SiGe oxidation described below in conjunction with FIG. 6). The material of the liner 210 may initially be deposited over the entire structure, followed by a directional etch that removes the material of the liner 210 from the top surface of the substrate 202 between the vertical fins 301 (and from the top surface of the hard mask layer 208 over each of the vertical fins 301). The liner 210 may have a thickness (in direction X-X') in the range of 2 nm to 12 nm.

Figure 5:
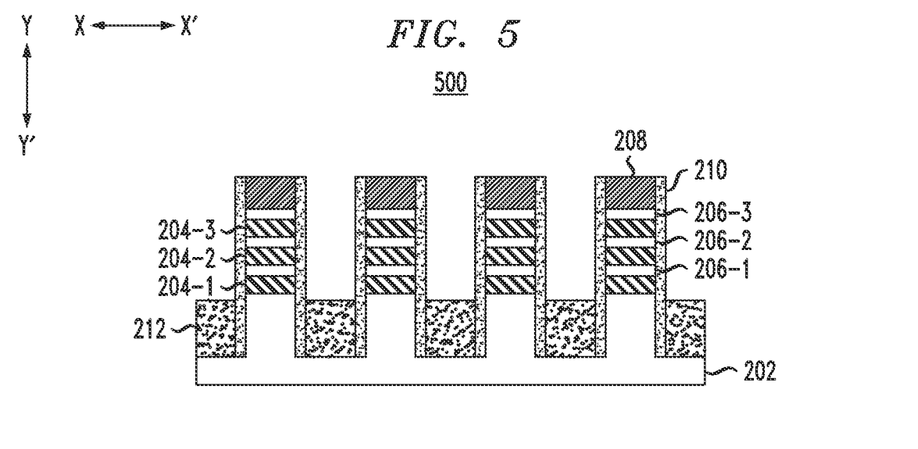
FIG. 5 depicts a cross-sectional view of the FIG. 4 structure following selective epitaxial growth, according to an embodiment of the invention.

FIG. 5 shows a cross-sectional view 500 of the FIG. 4 structure following selective epitaxial growth of layer 212. The layer 212 may be formed of SiGe, and thus may also be referred to as SiGe epitaxial layer 212. The SiGe epitaxial layer 212 may have a relatively high Ge % (e.g., higher than that of the sacrificial SiGe layers 206), such as a Ge % of 30 or greater (up to 100 or pure Ge). The higher Ge % of SiGe epitaxial layer 212 advantageously facilitates oxidation of the SiGe epitaxial layer 212. The SiGe epitaxial layer 212 may have a height or vertical thickness (in direction Y-Y') in the range of 5 nm to 200 nm, though the top surface of the SiGe epitaxial layer 212 should generally be below a bottom surface of the sacrificial layer 204-1 (e.g., below a bottom surface of the nanosheet channel stack).

Figure 6:
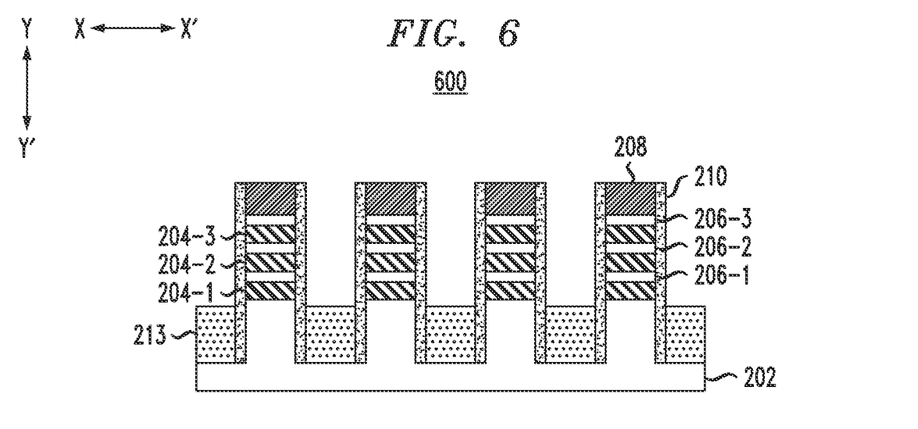
FIG. 6 depicts a cross-sectional view of the FIG. 5 structure following selective oxidation of the epitaxially grown layers, according to an embodiment of the invention.

FIG. 6 shows a cross-sectional view 600 of the FIG. 5 structure following selective oxidation of the SiGe epitaxial layer 212. The selective oxidation may utilize an oxidation process with a moderate temperature (e.g., in the range of 400° C. to 800° C.) and a high pressure (e.g., in the range of over 1 atmosphere). The oxidation process is self-limited, in that it will stop when reaching the top surface of the substrate 202 as the oxidation conditions are such that SiGe is selectively oxidized while Si (e.g., the material of the substrate 202) is not oxidized. A moderate temperature is used for the selective oxidation process so as to prevent Ge diffusion into the substrate 202. The oxidation rate and parameters may vary based on the Ge % of the SiGe epitaxial layer 212. The oxidation process will convert the SiGe of the SiGe epitaxial layer to SiGeOx. Any remaining Ge in the SiGeOx may be removed with an additional thermal treatment (e.g., a rapid thermal process (RTP)) to form SiOx layer 213. The SiOx layer 213 provides a portion of a STI layer or region in the resulting structure.

Figure 7:
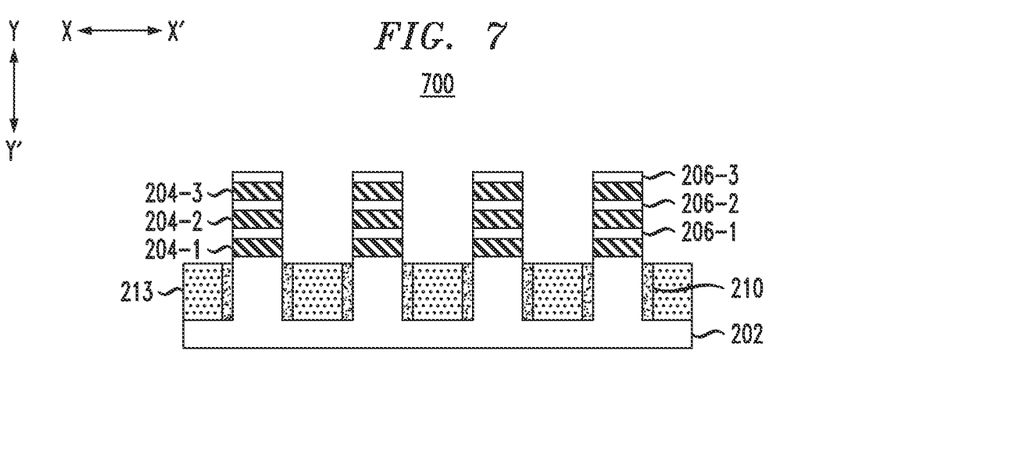
FIG. 7 depicts a cross-sectional view of the FIG. 6 structure following removal of the hard mask layer and recess of the liner, according to an embodiment of the invention.

FIG. 7 shows a cross-sectional view 700 of the FIG. 6 structure following removal of the hard mask layer 208 and recess of the liner 210 (e.g., such that a top surface of the liner 210 matches a top surface of the SiOx layer 213. In some embodiments, the hard mask layer 208 and liner 210 are formed of a same material (e.g., SiN), and thus may be removed using the same etching process (e.g., a hot phosphoric acid etch, a sulfur hexafluoride ($SF_6$) etch, or another suitable nitride etch chemistry).

Figure 8:
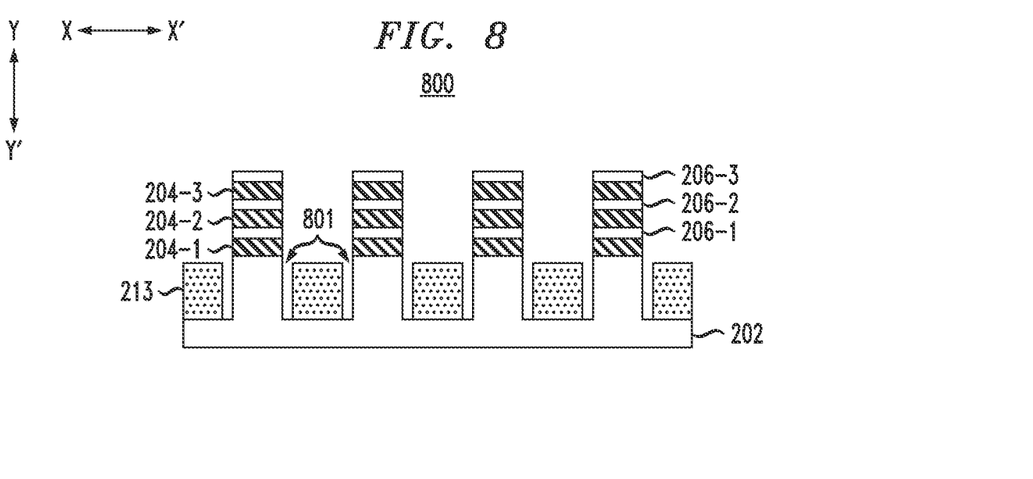
FIG. 8 depicts a cross-sectional view of the FIG. 7 structure following removal of remaining portions of the liner to form air gaps, according to an embodiment of the invention.

FIG. 8 shows a cross-sectional view 800 of the FIG. 7 structure following removal of remaining portions of the liner 210, creating air gaps 801 adjacent vertical sidewalls of the vertical fins 301. The remaining portions of the liner 210 may be removed by extending the etch process used in FIG. 7 (e.g., using an extended hot phosphoric acid etch or other suitable nitride etch), or using a dry etch chemistry.

Figure 9:
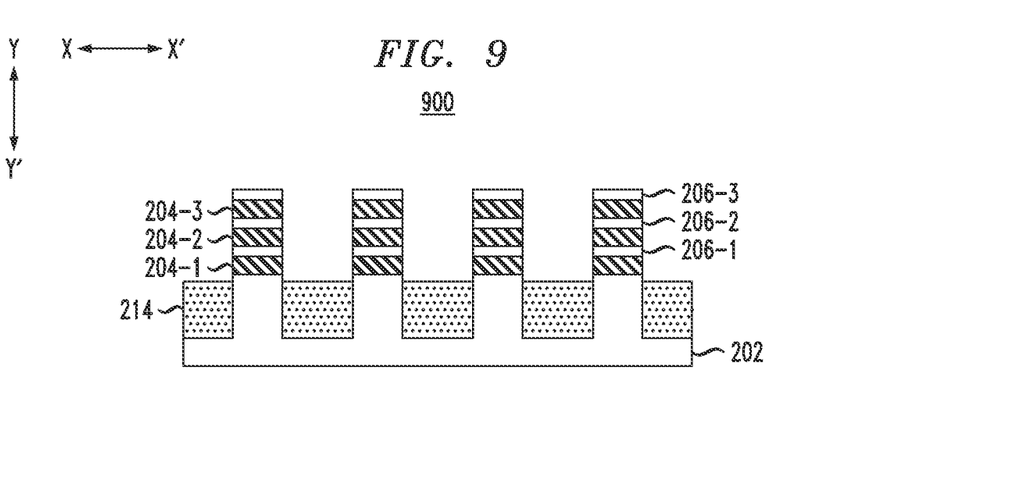
FIG. 9 depicts a cross-sectional view of the FIG. 8 structure following filling of the air gaps, according to an embodiment of the invention.

FIG. 9 shows a cross-sectional view 900 of the FIG. 8 structure following filling of the air gaps 801 with additional oxide material (e.g., SiOx). The additional oxide material and the SiOx layer 213 collectively provide STI layer or regions 214. The additional oxide material may be deposited over the entire structure sealing the cavities or air gaps 801, followed by using an isotropic etch to result in the STI layer or regions 214.

Figure 10:
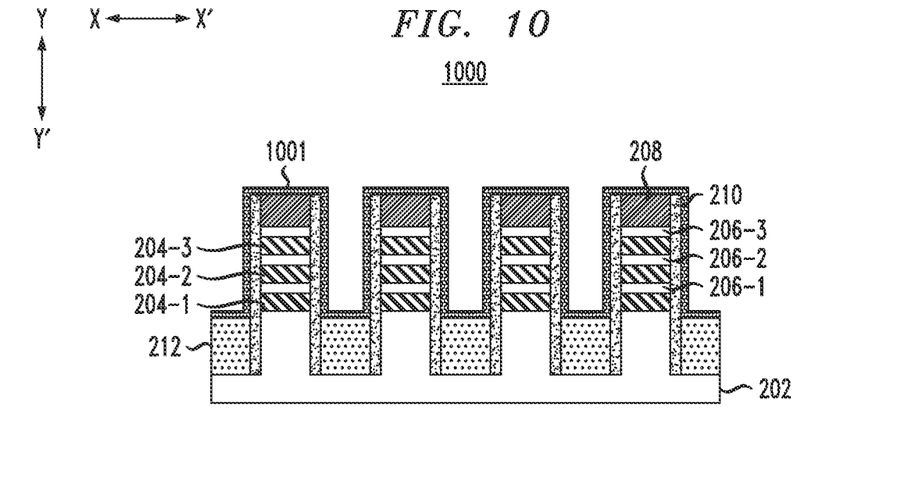
FIG. 10 depicts a cross-sectional view of the FIG. 5 structure following formation of a conformal liner, according to an embodiment of the invention.

FIG. 10 depicts a cross-sectional view 1000 of the FIG. 5 structure following formation of a conformal liner 1001. The conformal liner 1001 may be formed from a dielectric material, such as a nitride (e.g., SiN). The conformal liner 1001 may have a uniform thickness in the range of 2 nm to 20 nm.

Figure 11:
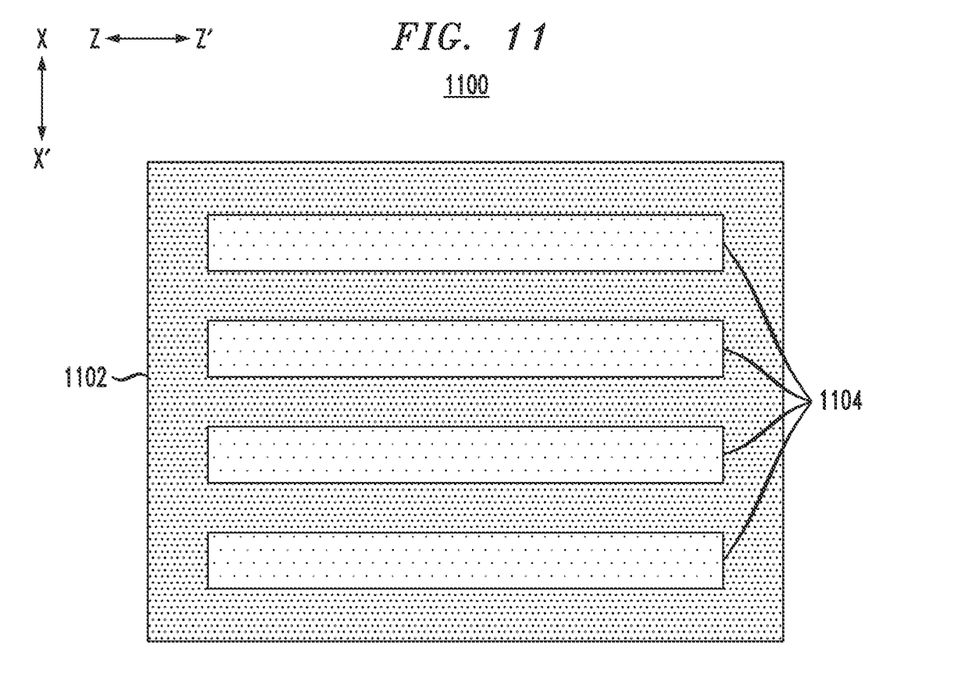
FIG. 11 depicts a top-down view illustrating fin regions formed over an isolation layer, according to an embodiment of the invention.

FIG. 11 depicts a top-down view 1100, illustrating fin regions 1104 and an isolation layer 1102 after the processing of FIG. 10, though the conformal liner 1001 that blankets the structure and the underlying hard mask layer 208 and liner 210 are not labeled for clarity of illustration.

Figure 12:
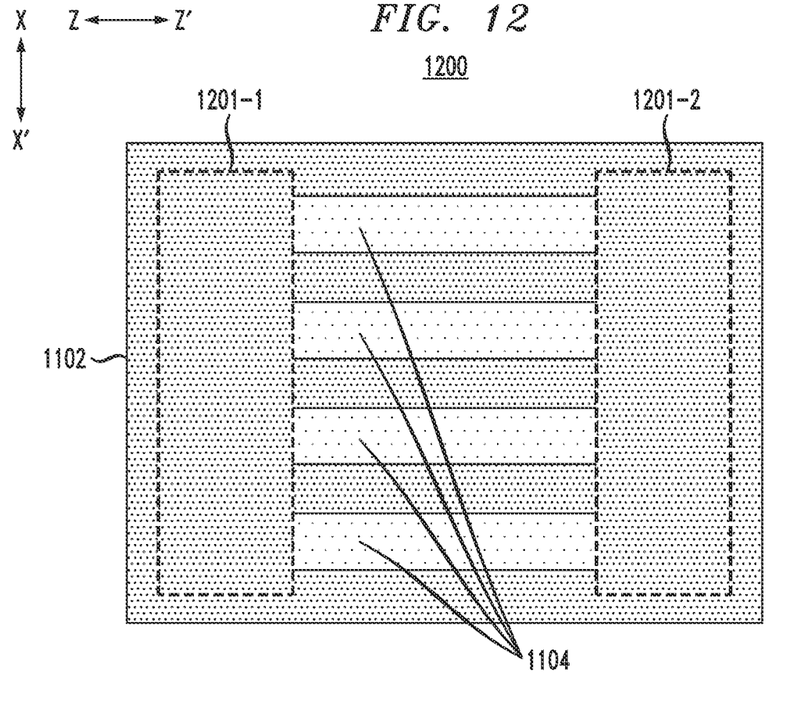
FIG. 12 depicts a top-down view of the FIG. 11 structure following a fin cut of ends of the fin regions, according to an embodiment of the invention.

FIG. 12 depicts a top-down view 1200 of the FIG. 11 structure following a fin cut. The fin cut removes portions of the fin regions 1104 that are perpendicular to ends of the vertical fins in regions 1201-1 and 1201-2 (collectively, fin cut regions 1201). Advantageously, this exposes the SiGe epitaxial layer 212 at ends of the fin regions 1104, while the conformal liner 1001 defines cavities where isolation material is later formed to provide a portion of STI layer or regions 214. Although in FIG. 12 there are two fin cut regions 1201 (e.g., one at each lateral end of the fin regions 1104), in other embodiments only one lateral end of the fin regions 1104 may be cut (e.g., only one of the fin cut regions 1201-1 and 1201-2 are formed). The SiGe epitaxial layer 212 would then be exposed at just one lateral end of the fin regions 1104, and the process for removal of the SiGe epitaxial layer 212 will be slower than when both lateral ends of the fin regions 1104 are exposed. The length (in direction Z-Z') of the fin cut regions 1201 may be in the range of 5 nm to several microns, such that the remaining portion of the fin regions 1104 has a length (in direction Z-Z') in the range of 50 nm to several microns.

Figure 13:
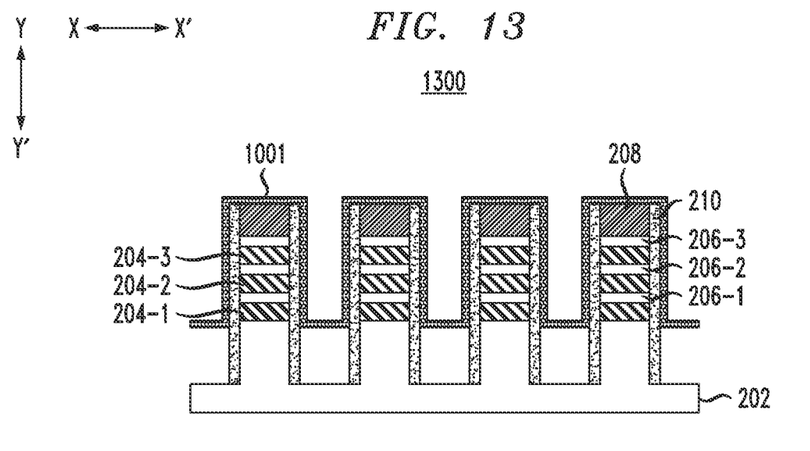
FIG. 13 depicts a cross-sectional view of the FIG. 10 structure following removal of the epitaxially grown layers from the cut ends of the fins, according to an embodiment of the invention.

FIG. 13 shows a cross-sectional view 1300 of the FIG. 10 structure following the fin cut process illustrated in FIGS. 10 and 11, and following removal of the SiGe layer 212 from the lateral ends of the vertical fins 301 that are exposed by the fin cut process of FIGS. 10 and 11. The SiGe epitaxial layer 212 may be removed using a vapor-phase etch or dry etch that removes SiGe selective to Si.

Figure 14:
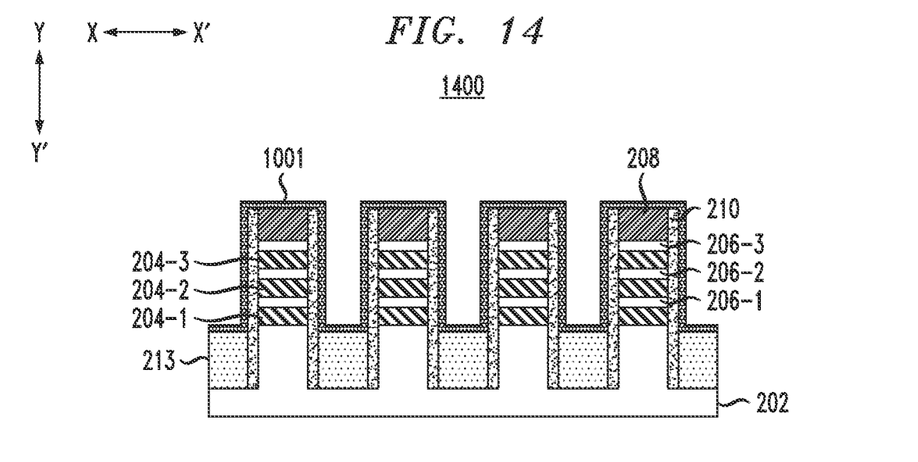
FIG. 14 depicts a cross-sectional view of the FIG. 13 structure following filling regions exposed by removal of the epitaxially grown layers with an isolation material, according to an embodiment of the invention.

FIG. 14 shows a cross-sectional view 1400 of the FIG. 13 structure following refill and etching with a dielectric material (e.g., an oxide) to form layer 213 in the cavities between the vertical fins 301 formed by removal of the SiGe layer 212. The structure of FIG. 14 may then be subject to processing similar to that described above with respect to FIGS. 7-9. The conformal liner 1001, which may be formed of the same material as the hard mask layer 208 and liner 210, may be removed during a same processing step (e.g., the processing described above with respect to FIG. 7), resulting in the structure shown in FIG. 7. Remaining portions of the liner 210 may then be removed resulting in the structure shown in FIG. 8. Additional oxide or other dielectric material is then filled in the air gaps 801 and an isotropic etch is performed to result in the structure shown in FIG. 9 with STI layer or regions 214.

Figure 15:
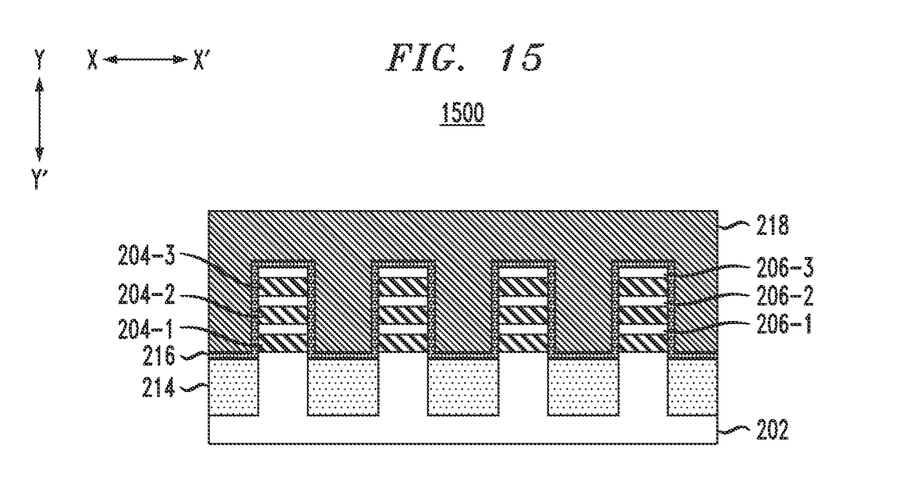
FIG. 15 depicts a cross-sectional view of the FIG. 9 structure following formation of an oxide liner and a dummy gate, according to an embodiment of the invention.

The FIG. 9 structure may be subject to further processing to form nanosheet FETs. For example, FIG. 15 shows a cross-sectional view 1500 of the FIG. 9 structure following formation of a liner 216 (e.g., an oxide liner) and after deposition and patterning of a dummy gate 218. This structure may be subject to further processing, including epitaxial growth of source/drain regions, fill with an interlayer dielectric (ILD) followed by planarization using CMP. The dummy gate 218 may then be pulled, followed by etch of the sacrificial layers 204 (e.g., sacrificial SiGe removal) and replacement metal gate processing. The structure may then be subject to additional processing for middle of line (MOL) and back end of line (BEOL) fabrication.

In some embodiments, a method of forming a semiconductor structure comprises forming a semiconductor layer stack comprising a substrate and a nanosheet channel stack over the substrate, the nanosheet channel stack comprising alternating layers of a sacrificial material and a semiconducting material providing nanosheet channels for one or more nanosheet FETs. The method also comprises forming one or more vertical fins in at least a portion of the semiconductor layer stack, forming a liner on vertical sidewalls of the one or more vertical fins, and forming a sacrificial epitaxial layer over a top surface of the substrate surrounding the one or more vertical fins. The method further comprises replacing the sacrificial epitaxial layer with a first dielectric layer, removing the liner to form air gaps between the first dielectric layer and the vertical sidewalls of the one or more vertical fins, and forming a second dielectric layer in the air gaps between the first dielectric layer and the vertical sidewalls of the one or more vertical fins. The first dielectric layer and the second dielectric layer provide STI regions surrounding at least a portion of the vertical sidewalls of the one or more vertical fins below the nanosheet channel stack.

The nanosheet channel stack may comprise alternating layers of (i) SiGe with a first Ge % providing the sacrificial material and (ii) Si providing the semiconducting material for the nanosheet channels of the one or more nanosheet FETs. The sacrificial epitaxial layer may comprise SiGe with a second Ge %, the second Ge % being greater than the first Ge %. The liner may comprise a nitride that protects the layers of SiGe with the first Ge % during replacement of the sacrificial epitaxial layer with the first dielectric layer. Replacing the sacrificial epitaxial layer with the first dielectric layer may comprise selectively oxidizing SiGe with the second Ge % to form the first dielectric layer comprising SiO$_2$ from the sacrificial epitaxial layer.

Replacing the sacrificial epitaxial layer with the first dielectric layer may comprise forming a conformal liner over the sacrificial epitaxial layer and the one or more vertical fins, performing a fin cut of at least one lateral end of the one or more vertical fins to expose the sacrificial epitaxial layer proximate said at least one lateral end, etching SiGe with the second Ge % to form one or more cavities surrounding the liner on vertical sidewalls of the one or more vertical fins between the conformal liner and the top surface of the substrate, and forming the first dielectric layer in the one or more cavities. Performing the fin cut may comprise cutting both lateral ends of the one or more vertical fins to expose the sacrificial epitaxial layer proximate both lateral ends of the one or more vertical fins.

Forming the one or more vertical fins may comprise patterning a hard mask layer over a top surface of semiconductor layer stack, and etching exposed portions of the nanosheet channel stack and at least a portion of the substrate. Forming the liner may comprise depositing a liner material over the one or more vertical fins and a top surface of the substrate surrounding the one or more vertical fins, and removing portions of the liner material formed on the top surface of the substrate surrounding the one or more vertical fins. The hard mask layer and the liner comprise a nitride material. Removing the liner to form the air gaps between the first dielectric layer and the vertical sidewalls of the one or more vertical fins may comprise utilizing a first nitride etchant to remove the hard mask layer and portions of the liner above a top surface of the first dielectric layer, and utilizing a second nitride etchant to remove the portions of the liner below the top surface of the first dielectric layer. The first nitride etchant and the second nitride etchant may be the same nitride etchant.

Forming the second dielectric layer in the air gaps between the first dielectric layer and the vertical sidewalls of the one or more vertical fins may comprise forming a dielectric material in the air gaps, over the first dielectric layer, and over the one or more vertical fins, and etching portions of the dielectric material above a top surface of the first dielectric layer and over the one or more vertical fins such that a top surface of the second dielectric layer matches a top surface of the first dielectric layer.

The first dielectric layer and the second dielectric layer may comprise an oxide.

In some embodiments, a semiconductor structure comprises a substrate and one or more vertical fins disposed over a top surface of the substrate, the one or more vertical fins comprising a first semiconductor layer and a nanosheet channel stack disposed over the first semiconductor layer, the nanosheet channel stack comprising one or more layers of a semiconducting material providing nanosheet channels for one or more nanosheet FETs. The semiconductor structure also comprises a first dielectric layer disposed over the top surface of the substrate spaced apart from vertical sidewalls of the one or more vertical fins, and a second dielectric layer disposed over the top surface of the substrate between the first dielectric layer and the vertical sidewalls of the first semiconductor layer. The first dielectric layer and the second dielectric layer provide STI regions surrounding at least a portion of the vertical sidewalls of the first semiconductor layer below the nanosheet channel stack.

The first dielectric layer and the second dielectric layer may comprise an oxide. The second dielectric layer may be disposed directly against the vertical sidewalls of the first semiconductor layer without a liner disposed between the STI regions and said portion of the vertical sidewalls of the first semiconductor layer.

In another embodiment, an integrated circuit comprises a nanosheet FET structure comprising a substrate and one or more vertical fins disposed over a top surface of the substrate, the one or more vertical fins comprising a first semiconductor layer and a nanosheet channel stack disposed over the first semiconductor layer, the nanosheet channel stack comprising one or more layers of a semiconducting material providing nanosheet channels for one or more nanosheet FETs of the nanosheet FET structure. The nanosheet FET structure also comprises a first dielectric layer disposed over the top surface of the substrate spaced apart from vertical sidewalls of the one or more vertical fins, and a second dielectric layer disposed over the top surface of the substrate between the first dielectric layer and the vertical sidewalls of the first semiconductor layer. The first dielectric layer and the second dielectric layer provide STI regions surrounding at least a portion of the vertical sidewalls of the first semiconductor layer below the nanosheet channel stack.

The first dielectric layer and the second dielectric layer may comprise an oxide. The second dielectric layer may be disposed directly against the vertical sidewalls of the first semiconductor layer without a liner disposed between the STI regions and said portion of the vertical sidewalls of the first semiconductor layer.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a semiconductor layer stack comprising a substrate and a nanosheet channel stack over the substrate, the nanosheet channel stack comprising alternating layers of a sacrificial material and a semiconducting material providing nanosheet channels for one or more nanosheet field-effect transistors;
    forming one or more vertical fins in at least a portion of the semiconductor layer stack;
    forming a liner on vertical sidewalls of the one or more vertical fins;
    forming a sacrificial epitaxial layer over a top surface of the substrate surrounding the one or more vertical fins;
    replacing the sacrificial epitaxial layer with a first dielectric layer;
    removing the liner to form air gaps between the first dielectric layer and the vertical sidewalls of the one or more vertical fins; and
    forming a second dielectric layer in the air gaps between the first dielectric layer and the vertical sidewalls of the one or more vertical fins;
    wherein the first dielectric layer and the second dielectric layer provide shallow trench isolation regions surrounding at least a portion of the vertical sidewalls of the one or more vertical fins below the nanosheet channel stack.

2. The method of claim 1, wherein the nanosheet channel stack comprises alternating layers of (i) silicon germanium with a first germanium percentage providing the sacrificial material and (ii) silicon providing the semiconducting material for the nanosheet channels of the one or more nanosheet field-effect transistors.

3. The method of claim 2, wherein the sacrificial epitaxial layer comprises silicon germanium with a second germanium percentage, the second germanium percentage being greater than the first germanium percentage.

4. The method of claim 3, wherein the liner comprises a nitride that protects the layers of silicon germanium with the first germanium percentage during replacement of the sacrificial epitaxial layer with the first dielectric layer.

5. The method of claim 4, wherein replacing the sacrificial epitaxial layer with the first dielectric layer comprises selectively oxidizing silicon germanium with the second germanium percentage to form the first dielectric layer comprising silicon dioxide from the sacrificial epitaxial layer.

6. The method of claim 4, wherein replacing the sacrificial epitaxial layer with the first dielectric layer comprises:
forming a conformal liner over the sacrificial epitaxial layer and the one or more vertical fins;
performing a fin cut of at least one lateral end of the one or more vertical fins to expose the sacrificial epitaxial layer proximate said at least one lateral end;
etching silicon germanium with the second germanium percentage to form one or more cavities surrounding the liner on vertical sidewalls of the one or more vertical fins between the conformal liner and the top surface of the substrate; and
forming the first dielectric layer in the one or more cavities.

7. The method of claim 6, wherein performing the fin cut comprises cutting both lateral ends of the one or more vertical fins to expose the sacrificial epitaxial layer proximate both lateral ends of the one or more vertical fins.

8. The method of claim 1, wherein forming the one or more vertical fins comprises:
patterning a hard mask layer over a top surface of semiconductor layer stack; and
etching exposed portions of the nanosheet channel stack and at least a portion of the substrate.

9. The method of claim 8 wherein forming the liner comprises:
depositing a liner material over the one or more vertical fins and a top surface of the substrate surrounding the one or more vertical fins; and
removing portions of the liner material formed on the top surface of the substrate surrounding the one or more vertical fins.

10. The method of claim 9, wherein the hard mask layer and the liner comprise a nitride material.

11. The method of claim 10, wherein removing the liner to form the air gaps between the first dielectric layer and the vertical sidewalls of the one or more vertical fins comprises:
utilizing a first nitride etchant to remove the hard mask layer and portions of the liner above a top surface of the first dielectric layer; and
utilizing a second nitride etchant to remove the portions of the liner below the top surface of the first dielectric layer.

12. The method of claim 11, wherein the first nitride etchant and the second nitride etchant are the same nitride etchant.

13. The method of claim 1, wherein forming the second dielectric layer in the air gaps between the first dielectric layer and the vertical sidewalls of the one or more vertical fins comprises:
forming a dielectric material in the air gaps, over the first dielectric layer, and over the one or more vertical fins; and
etching portions of the dielectric material above a top surface of the first dielectric layer and over the one or more vertical fins such that a top surface of the second dielectric layer matches a top surface of the first dielectric layer.

14. The method of claim 1, wherein the first dielectric layer and the second dielectric layer comprise an oxide.

* * * * *